US006721377B1

(12) United States Patent
Jenkner et al.

(10) Patent No.: US 6,721,377 B1
(45) Date of Patent: Apr. 13, 2004

(54) METHOD AND CIRCUIT CONFIGURATION FOR RESYNCHRONIZING A CLOCK SIGNAL

(75) Inventors: Christian Jenkner, Velden (AT); Gerhard Nössing, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/507,356

(22) Filed: Feb. 18, 2000

(30) Foreign Application Priority Data

Feb. 18, 1999 (DE) .......................................... 199 06 866

(51) Int. Cl.[7] .............................................. H04L 7/00
(52) U.S. Cl. ........................ 375/354; 375/374; 327/151
(58) Field of Search ................. 375/354, 369, 375/376, 374; 713/400, 500, 502; 327/151

(56) References Cited

U.S. PATENT DOCUMENTS

| 4,903,283 | A | | 2/1990 | Eisenberg |
| 5,926,048 | A | * | 7/1999 | Greatwood .................. 327/160 |
| 6,316,974 | B1 | * | 11/2001 | Traci et al. .................. 327/147 |
| 6,404,161 | B1 | * | 6/2002 | Roubinet et al. ........... 318/705 |

FOREIGN PATENT DOCUMENTS

DE          37 19 582 C2    12/1988

OTHER PUBLICATIONS

Non–Patent Document "Electronic Circuits" (Tietze et al.), Springer Verlag, pp. 860–870.

* cited by examiner

Primary Examiner—Temesghan Ghebretinsae
(74) Attorney, Agent, or Firm—Laurence A. Greenberg; Werner H. Stemer; Gregory L. Mayback

(57) ABSTRACT

A method for resynchronizing a clock signal, includes the steps of defining a presettable clock signal, dividing a first clock signal having a first frequency with a programmable digital frequency divider to produce a second clock signal having a second frequency, measuring the second clock signal with a digital control circuit, and programming a programmable digital frequency divider with the digital control circuit, such that the second clock signal corresponds to the presettable clock signal. The invention also includes a circuit configuration for resynchronizing a clock signal, including a programmable digital frequency divider for dividing a first clock signal to produce second clock signal, a digital measuring circuit, connected to the frequency divider, for measuring the second clock signal and generating an output signal, and a digital control circuit, connected to the frequency divider and to the measuring circuit, for evaluating the output signal from the measuring circuit and for adjusting the frequency divider.

6 Claims, 1 Drawing Sheet

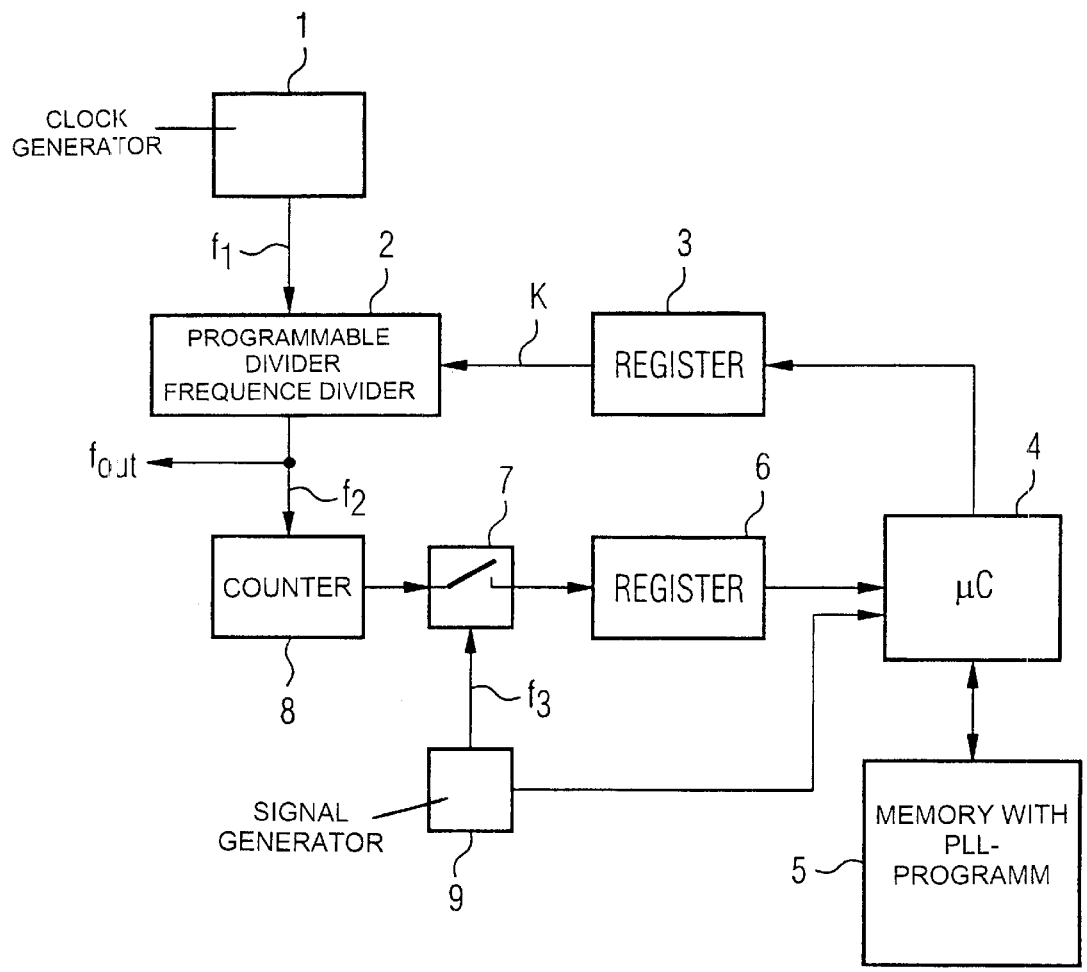

METHOD AND CIRCUIT CONFIGURATION FOR RESYNCHRONIZING A CLOCK SIGNAL

BACKGROUND OF THE INVENTION

FIELD OF THE INVENTION

The invention lies in the field of electronics. The invention relates to a method for resynchronizing a clock signal and to a circuit configuration for resynchronizing a clock signal.

When producing a clock signal from a reference clock signal, it is frequently necessary to resynchronize the clock signal in order to keep deviations from the reference clock signal as small as possible. To ensure small deviations, resynchronization circuits—also called phase locked loops (PLL)—are used. A resynchronization circuit is a control circuit in which the reference clock signal and the clock signal are continually compared and, based upon the comparison, the clock signal is resynchronized using a control circuit. Essential information on resynchronization circuits (PLLs) can be found, for example, in Tietze, Schenk "Electronic Circuits Design and Applications", 1990, a translation of Tietze, Schenk "Halbleiter Schaltungstechnik [Semiconductor Circuitry]", Ninth Edition, 1990. PLLs are usually constructed as analog circuits. However, there is a disadvantage related to changing the clock signal in analog circuits. To make such a change, either the PLL circuitry needs to be changed or the PLL needs to have adjustable parameters, both of which are very complicated to produce when using analog circuitry. Furthermore, the circuit complexity is greatly increased when producing very accurate analog circuitry PLLs.

SUMMARY OF THE INVENTION

It is accordingly an object of the invention to provide a method and a circuit configuration for resynchronizing a clock signal that overcomes the hereinafore-mentioned disadvantages of the heretofore-known devices and methods of this general type and that has a high degree of accuracy and can easily be matched to different requirements.

With the foregoing and other objects in view, there is provided, in accordance with the invention, a method for resynchronizing a clock signal, including the steps of defining a presettable clock signal, dividing a first clock signal having a first frequency with a programmable digital frequency divider to produce the frequency of a second clock signal, measuring the second clock signal with a digital control circuit, and programming a programmable digital frequency divider with the digital control circuit such that the second clock signal corresponds to the presettable clock signal.

For resynchronization, the method according to the invention uses only digital means, which are easy to produce and can be matched to different requirements by simple reprogramming.

In accordance with another mode of the invention, a third signal is defined and the measuring step is performed by measuring the second clock signal with the digital control circuit at time intervals predetermined by the third signal.

The digital control circuit preferably measures the second clock signal at time intervals predetermined by a third signal. Resynchronization is then advantageously carried out only at instants predetermined by the third signal. Thus, by adjusting the third signal, it is possible to set the time intervals for the measurements by the digital control circuit, and, therefore, the resynchronization instants. This is particularly advantageous if resynchronization is required only at particular instants.

In accordance with a further mode of the invention, a program is processed with the digital control circuit for establishing a discrepancy between the second clock signal and the presettable clock signal.

A particular preference is that the digital control circuit processes a program that establishes a discrepancy between the second clock signal and the presettable clock signal. By changing the program for establishing the discrepancy between the second clock signal and the presettable clock signal, it is possible to respond to a wide variety of requirements.

The advantage of the method according to the invention is, thus, the adaptability to different requirements and the simple manufacture that results by using digital means.

With the objects of the invention in view, there is also provided a circuit configuration for resynchronizing a clock signal, including a programmable digital frequency divider for dividing a first clock signal to produce second clock signal, a digital measuring circuit, connected to the frequency divider, for measuring the second clock signal and generating an output signal, and a digital control circuit, connected to the frequency divider and to the measuring circuit, for evaluating the output signal from the measuring circuit and, based upon the evaluation, for adjusting the frequency divider.

In accordance with an added feature of the invention, the second clock signal has pulses and the measuring circuit has a counter that counts the pulses of the second clock signal and a first register that stores a counter value of the counter.

In accordance with an additional feature of the invention, the control circuit has a microcontroller and a program memory.

A particular preference is that the digital control circuit has a microcontroller and a program memory. The microcontroller processes a program that is stored in the program memory and resynchronizes the second clock signal with the presettable clock signal. Simple reprogramming of the program memory allows the resynchronization algorithm to be matched to different requirements.

In accordance with a concomitant feature of the invention, there is provided a second register, the frequency divider to be digitally adjusted with the second register, the second register to be written to by the control circuit.

The programmable digital frequency divider can preferably be adjusted digitally by the second register, which can be written to by the digital control circuit. When the discrepancy between the second clock signal and the presettable clock signal has been evaluated, the digital control circuit calculates a value that is written to the second register. The second register acts directly on the operation of the programmable digital frequency divider, whose division ratio is set by the value stored in the second register.

Other features that are considered as characteristic for the invention are set forth in the appended claims.

Although the invention is illustrated and described herein as embodied in a method and a circuit configuration for resynchronizing a clock signal, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure is a block diagram of the circuit configuration for resynchronizing a clock signal according to the invention.

DESCRIPTION OF THE PREFERRED EMBODIMENT

The embodiment set forth below describes a circuit configuration that clocks a digital signal processor and a digital filter connected upstream of the digital signal processor. In the configuration, the digital filter is supplied with samples of an analog signal at a clock frequency of x·2.048 MHz. The output signal from the digital filter, which is clocked at a clock frequency of x·2.048 MHz, has a clock frequency of x·128 kHz. The output signal from the digital signal processor, which is clocked at a clock frequency of x·16.384 MHz, in turn has a clock frequency of x·n·8 kHz. As such, the factor n is predetermined by a signal synchronizing with a time frame of a PCM transmission. Accordingly, the circuit configuration for resynchronizing a clock signal must provide a clock frequency of x·16.384 MHz for the digital signal processor. The digital filter's clock frequency of x·2.048 MHz is derived by dividing the clock frequency of x·16.384 MHz by 8. The ratio of the two frequencies $f_1$ and $f_2$ can then be between 1 and 2.

Referring now to the single figure of the drawing, a clock generator 1 produces the first clock signal that has a first frequency $f_1$. The first clock signal is supplied to a programmable digital frequency divider 2. The programmable digital frequency divider 2 divides the frequency $f_1$ of the first clock signal based upon the following formula:

$$f_2 = f_1 \cdot \left(1 + \frac{32768 + K}{2 \cdot 32768}\right)^{-1}$$

The factor K, which is a 16-bit value, can be used to adjust the division ratio of the frequency divider. In this context, the factor K has a value range of —32768 to 32767 in two's complement. To implement the above formula, the frequency divider has a multiplexer and a digital circuit that can be configured, for example, as a standard cell circuit on an integrated circuit. The digital circuit controls the multiplexer, which can be switched over between the first clock signal and the halved first clock signal as input signals. The output clock signal of the programmable digital frequency divider 2 must have no spikes in the configuration and must be switchable every half cycle. The 16-bit factor K in the above formula is predetermined by the content of a 16-bit register 3.

The frequency divider 2 outputs a second clock signal, having a frequency $f_2$, which is supplied to a counter 8. The counter 8 counts the pulses of the second clock signal.

A switch 7 controlled by a signal having a frequency $f_3$ is used to write the output signal from the counter 8, the count value, to a 12-bit register 6. A signal generator 9 produces the signal having the frequency $f_3$, which predetermines the resynchronization instants for the second clock signal.

With each cycle of the signal from the signal generator 9, a microcontroller 4 reads out the content of the 12-bit register 6 and uses the values read out from the 12-bit register 6 to calculate a discrepancy between the second clock signal and a presettable clock signal having a frequency $f_{out}$. Between two pulses of the signal from the signal generator 9, i.e., two read cycles, the difference between the counter values read out for a stable second clock signal is, for example, supposed to be 2048. To establish deviations from the nominal value 2048 and to start resynchronization, the microcontroller 4 processes a program stored in a memory 5. The memory 5 is preferably a read/write memory and, thus, allows reprogramming of the program processed by the microcontroller 4. To accomplish reprogramming, the program first calculates the discrepancies between the second clock signal and the presettable clock signal having the frequency $f_{out}$, and the microcontroller 4 uses the 16-bit register 3 to reprogram the programmable digital frequency divider 2 appropriately.

Therefore, changing the presettable clock signal allows the second clock signal to be changed, and changing the signal having the frequency $f_3$ allows the potential resynchronization instants of the second clock signal to be set. Accordingly, the method on which the invention is based and the corresponding circuit configuration can be matched to different clock signals and operating requirements.

We claim:

1. A method for resynchronizing a clock signal, which comprises;

defining a presettable clock signal;

dividing a first clock signal having a first frequency with a programmable digital frequency divider to produce a second clock signal having a second frequency;

measuring the second clock signal with a digital measuring circuit having a counter to count clock cycles of the second clock signal;

generating a third clock signal having a third frequency;

periodically synchronizing a first register configured to store counter values with the counter using a switch actuated by the third clock signal; and programming the programmable digital frequency divider with a digital control circuit according to the counter values stored in the first register such that the second clock signal corresponds to the presettable clock signal.

2. The method according to claim 1, further comprises performing the measuring step by measuring the second clock signal with the digital measuring circuit at time intervals predetermined by the third clock signal.

3. The method according to claim 1, further comprises processing a program for establishing the discrepancy between the second clock signal and the presettable clock signal with the digital control circuit.

4. A circuit for resynchronizing a clock signal, comprising:

a programmable digital frequency divider for dividing a first clock signal to produce a second clock signal;

a digital measuring circuit, connected to said frequency divider, for measuring the second clock signal and generating an output signal, the digital measuring circuit having a counter to count clock cycles of the second clock signal, a first register to store counter values, a controllable switch selectively coupling said counter to said first register, and a signal generator for generating a third clock signal to control said switch; and a digital control circuit, connected to said frequency divider and to said digital measuring circuit, for evaluating the output signal from said digital measuring circuit and for adjusting said frequency divider via a second register, said digital control circuit having a microcontroller and a program memory.

5. The circuit configuration according to claim 4 wherein the second clock signal has pulses and said measuring circuit has a pulse counter that counts the pulses of the second clock signal and has a pulse counter value, and a first pulse register that stores the pulse counter value.

6. The circuit configuration according to claim 4, wherein said frequency divider is configured to be digitally adjusted with said second register, said second register is configured to be written to by said control circuit.

* * * * *